(12) United States Patent
Ericson et al.

(10) Patent No.: US 10,498,361 B2
(45) Date of Patent: Dec. 3, 2019

(54) METHODS AND APPARATUSES FOR GROUP TRANSMISSIONS

(71) Applicant: Telefonaktiebolaget LM Ericsson (publ), Stockholm (SE)

(72) Inventors: Mårten Ericson, Luleå (SE); Jan Christoffersson, Luleå (SE); Min Wang, Luleå (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 65 days.

(21) Appl. No.: 15/523,612

(22) PCT Filed: Apr. 20, 2016

(86) PCT No.: PCT/EP2016/058740
§ 371 (c)(1),
(2) Date: May 1, 2017

(87) PCT Pub. No.: WO2017/182068
PCT Pub. Date: Oct. 26, 2017

(65) Prior Publication Data
US 2018/0198465 A1  Jul. 12, 2018

(51) Int. Cl.
*H04L 1/00* (2006.01)
*H04L 1/18* (2006.01)
(Continued)

(52) U.S. Cl.
CPC .......... *H03M 13/096* (2013.01); *H04B 7/026* (2013.01); *H04L 1/0061* (2013.01);
(Continued)

(58) Field of Classification Search
CPC ..... H04L 1/0061; H04L 12/12; H04L 1/1812; H04L 1/1874; H04L 63/065; H04L 9/32; H04W 4/08; H03M 13/096
See application file for complete search history.

(56) References Cited

U.S. PATENT DOCUMENTS 5,020,132 A * 5/1991 Nazarenk .............. H04L 1/1607
455/17
5,128,930 A * 7/1992 Nazarenko ............ H04L 1/1607
370/340
(Continued)

FOREIGN PATENT DOCUMENTS

CN         101160733 A      4/2008
EP         2584757 A1       4/2013
(Continued)

OTHER PUBLICATIONS

International Search Report and Written Opinion dated Dec. 22, 2016 for International Application Serial No. PCT/EP2016/058740, International Filing Date: Apr. 20, 2016 consisting of 10-pages.
3GPP TR 22.803 V12.2.0; "3rd Generation Partnership Project; Technical Specification Group Services and System Aspects; Feasibility Study for Proximity Services (ProSe) (Release 12)," Jun. 2013, 45 pages.
(Continued)

*Primary Examiner* — Phung M Chung
(74) *Attorney, Agent, or Firm* — Sage Patent Group

(57) ABSTRACT

The embodiments herein relate to a first user equipment (UE), a second UE and methods thereof for reliable group transmissions. The group includes multiple UEs transmitting the same Hybrid Automatic Repeat request (HARQ), buffer data packets to a network node. The method in the first UE includes receiving a predetermined number of Non ACKnowledgments (NACKs), performing a checksum calculation on the HARQ buffer, receiving a computed checksum from a second UE acting as a coordinator of the group; comparing the calculated checksum with the received computed checksum and stopping/refraining from further transmission of the HARQ buffer data to the network node when the calculated checksum and the received computed checksum differ.

19 Claims, 11 Drawing Sheets

(51) Int. Cl.
  *H03M 13/09* (2006.01)
  *H04L 1/06* (2006.01)
  *H04B 7/026* (2017.01)

(52) U.S. Cl.
  CPC .............. *H04L 1/06* (2013.01); *H04L 1/1867* (2013.01); *H04L 1/1874* (2013.01); *H04L 1/1812* (2013.01); *H04L 2001/0093* (2013.01)

(56) References Cited

U.S. PATENT DOCUMENTS

| | | | |
|---|---|---|---|
| 5,206,863 A * | 4/1993 | Nazarenko | H04L 1/14 714/752 |
| 6,904,110 B2 | 6/2005 | Trans et al. | |
| 8,948,770 B2 | 2/2015 | Du et al. | |
| 9,172,512 B2 * | 10/2015 | Maaref | H04L 1/1816 |
| 9,756,482 B2 | 9/2017 | Ericson | |
| 2009/0111456 A1 | 4/2009 | Shaffer et al. | |
| 2011/0032832 A1 | 2/2011 | Jalali et al. | |
| 2013/0029680 A1 | 1/2013 | Park et al. | |
| 2014/0173372 A1 | 6/2014 | Maaref et al. | |
| 2014/0179330 A1 | 6/2014 | Du et al. | |

FOREIGN PATENT DOCUMENTS

| | | |
|---|---|---|
| WO | 1998013940 A1 | 4/1998 |
| WO | 2003/003672 A2 | 1/2003 |
| WO | 2008/123662 A1 | 10/2008 |
| WO | 2010/049801 A1 | 5/2010 |
| WO | 2011/005708 A1 | 1/2011 |
| WO | 2011/135555 A1 | 11/2011 |
| WO | 2014/081354 A1 | 5/2014 |
| WO | 2015142232 A1 | 9/2015 |
| WO | 2015/163798 A1 | 10/2015 |

OTHER PUBLICATIONS

Elmenriech et al., "Building Blocks of Cooperative Relaying in Wireless Systems," Lakeside Labs, Institute of Networked and Embedded Systems, Univ. of Klagenfurt, Aug. 14, 2008, 9 pages.

Dohler, M., "Virtual Antenna Arrays," Department of Electrical and Electronic Engineering, King's College London, University of London, Nov. 2003, 206 pages.

International Search Report and Written Opinion for International Application No. PCT/SE2014/050484, dated Dec. 11, 2014, 20 pages.

Haija et al., "Spectral Efficiency and Outage Performance for Hybrid D2D-Infrastructure Uplink Cooperation," Mar. 29, 2014, 30 pages.

Mudumbai et al., "On the Feasibility of Distributed Beamforming in Wireless Networks," Wireless Communications, IEEE Transactions on Wireless Communications, vol. 6, No. 5, May 2007, pp. 1754, 1763, 10 pages.

Li et al., "Cooperative Communication Based on Random Beamforming Strategy in Wireless Sensor Networks,", Globecom 2012— Wireless Commuications Symposium, IEEE, Dec. 3-7, 2012, pp. 4108, 4113, 6 pages.

Ericson et al., "UL Group Transmission Concept," GFTE-15:000222 Uen, 31 pages.

"Cooperative D2D Communications," METIS-II AII#3, ITRI, Jan. 18-21, 2016, 5 pages.

Belleschi et al., "Benchmarking Practical RRM Algorithms for D2D Communications in LTE Advanced," Ericsson AB, Sweden, KTH, Royal Institute of Technology, Sweden, University of Siena, Italy, Jun. 22, 2013, 30 pages.

Dohler et al., "Virtual Antenna Arrays for Future Wireless Mobile Communication Systems," Centre for Telecommunications Research, King's College London, 2002, 5 pages.

* cited by examiner

METHODS AND APPARATUSES FOR GROUP TRANSMISSIONS

CROSS-REFERENCE TO RELATED APPLICATIONS

This application is a Submission Under 35 U.S.C. § 371 for U.S. National Stage Patent Application of International Application Number: PCT/EP2016/058740, filed Apr. 20, 2016 entitled "METHODS AND APPARATUSES FOR GROUP TRANSMISSIONS," the entirety of which is incorporated herein by reference.

TECHNICAL FIELD

The present disclosure relates to the field of wireless communications, and in particular to methods and apparatuses for group transmissions.

BACKGROUND

Device-to-Device (D2D) or sidelink communications and cellular- or network-controlled D2D (sidelink) communications are expected to play an important role in the next generation wireless networks D2D technology can be used to provide diversity in space, time and frequency, and increase the robustness against fading and interference. User Equipment (UE) cooperation based on D2D is a technology that is receiving attention. With advances in D2D communications, UE cooperation is expected to play an important role in the future of wireless communication systems such as Long Term Evolution (LTE), also known as the fourth Generation (4G); enhanded LTE, eLTE advanced or fifth Generation (5G) and so on. Hereinafter by D2D communications is also meant sidelink communications.

One object with group transmission using D2D ("cooperative D2D") may be a way to increase the coverage and user bit rate for example in the future high frequency 5G network. As mentioned, UE cooperation based on D2D, or, in other words, cooperative D2D, is gaining traction in the industry. A concept how group transmission using D2D can be performed was developed recently. According to the concept, the respective UEs in the group of UEs transmit synchronized as one antenna array in order to increase the UpLink (UL) coverage and bit rate. The UEs first transmit the data within the group using D2D methods and then transmit the same data jointly to the network. This is shown in FIG. 1 depicting 3 UEs 101, 102 and 103 respectively and a radio network node 104 acting as a base station or an eNB or a NB or an accept point etc. The UpLink and DownLink directions are also depicted.

When UE 101 wants to send data, it sends data to the other UEs 102 and 103 in the group of UEs 150 via D2D. The same data is transmitted synchronized to the radio network node 104. DL (control) data is received by UE 102, here acting as a coordinator or a relay of the group, for further relaying the DL (control) data to the other UEs 101 and 103.

The benefit from group transmission stems from the fact that the Signal-to-Interference-plus-Noise-Ratio (SINR) from the different UEs can be added, i.e. according to:

$$SINR_{grouptx} = \sum_{u}^{GroupSize} SINR_{singletx}(u)$$

This is useful in low SINR scenarios or when the originating UE that wants to transmit data has a low SINR (or is even out of UL coverage) and the other UEs in the group have higher SINR. Hence, the SINR from the group transmission is typically considerably higher than for a specific UE within the group.

From a network node perspective, the group is seen as a single UE transmitting from different points. The group concept illustrated in FIG. 10 introduces a group IDendity (ID) which is used to hide from the network (node) that the group has several UEs. This simplifies the group transmission since the network (node) can reuse all DL legacy signaling (for single UEs) which may be relayed from the coordinator UE to the other group members or be received directly from the network node (e.g. eNodeB) by the UEs.

An illustration of a group of UEs (UE1, UE2, UE3) sharing a common queue with data for UL transmission is depicted in FIG. 2. The data from UE2 and UE3 have been distributed by D2D communication within the group before the UL transmissions to the network node. All UEs have identical group HARQ buffers. FIG. 2 is self-explanatory.

Further advantage of the group transmission is that also UEs that are out of UL coverage to the base station contribute to an increased SINR and hence UL throughput for the group.

With group transmission, the basic idea is that the network node or base station sees the group as one single UE and receives the same data synchronized from all UEs in the group. This means that all UEs must have the same data in their group transmission Hybrid Automatic Repeat ReQuest (HARQ) buffers and their transmissions completely synchronized. Since the UL transmissions rely on HARQ feedback, in the form of an ACKnowledgment (ACK) or Non-ACK (NACK), reception of the feedback need to be done by all UEs and also interpreted the same way by all UEs.

FIG. 3 illustrates two ways or methods 300A resp. 300B to transmit HARQ feedback.

In the first approach 300A, if the HARQ feedback (ACK/NACK) is transmitted via the coordinator, i.e. relayed, this leads to additional delays and the HARQ protocol would need to be altered in order to cater for the group transmissions (i.e. separate protocol for group transmissions would be needed). However, this approach would allow an increase of the reliability of the D2D link (e.g. using harder or different coding etc.) which would reduce the total error rate.

In the second approach 300B, the HARQ feedback (ACK/NACK) is transmitted to the individual UEs separately, there would be a risk that the HARQ feedback is interpreted differently at the different UEs causing reduced reliability even though, there would be no extra delays. This approach to transmit HARQ feedback is used in the embodiments that will be described in greater details in the detailed description part.

It should be noted that when the UEs HARQ buffers becomes unsynchronized, not only does it no longer increase the SINR of the group transmission, it even makes the performance worse than if it had not been a part of the group at all since it will generate interference instead. Hence, maintaining synchronization of the UL transmissions is of importance for efficient UL group transmissions.

An example that will lead to unsynchronized transmissions is illustrated in FIG. 4. A first UE (UE1) interprets a received ACK as a NACK. Then this first UE will attempt to retransmit the packet in a coming Transmission Time Interval (TTI). At the same time the other UEs in the group will transmit a different packet in this TTI. For the receiving network node or eNodeB, the retransmission from the first UE (UE1) will be received as noise or interference and make the reception of the correct signal from the other UEs more difficult. Hence the reception of the desired signal will be impaired by interference caused by the first UEs erroneous retransmission. This error will continue in subsequent TTIs as the first UE is unsynchronized with the other UEs in the group. Note that the same problem will occur if a NACK would be interpreted as an ACK. An illustration of the problem when a NACK is miss-interpreted as an ACK by one UE in the group is depicted in FIG. 4.

The possibility for a UE's HARQ buffer to become unsynchronized increases with the size of the group and may quickly become disturbing for the performance of the group transmission.

Autonomous HARQ retransmission may be another option for UL group transmission. UEs participating in group transmission always, in this Autonomous HARQ retransmission scenario, perform retransmission a given number of transmission attempts, regardless of the receiver's reception results. The receiver does not need to provide HARQ feedback. However, an issue is that autonomous retransmissions may increase the Radio Link Control (RLC) layer retransmissions and lead to degraded UL capacity.

SUMMARY

It is an object of embodiments herein to solve the above problems by providing a HARQ method and a UE or device for improving a group UL transmissions.

According to an aspect of embodiments herein, there is provided a method performed by a first UE for group transmission, the group comprising multiple UEs transmitting same HARQ buffer data packets to a network node in a synchronous manner, the data packets received from a UE in the group. The method comprising: receiving a predetermined number of NACKs, from the network node in response to transmitting the HARQ buffer data packets; performing a checksum calculation on the HARQ buffer; receiving a computed checksum from a second UE acting as a coordinator of the group; comparing the calculated checksum with the received computed checksum; and stopping or refraining from further transmission of the HARQ buffer data to the network node when the calculated checksum and the received computed checksum differ.

According to another aspect of embodiments herein, there is provided a method performed by a second UE, acting as a coordinator of a group transmission, the group comprising multiple UEs transmitting same HARQ buffer data packets to a network node ( ) in a synchronous manner, the method comprising: receiving a predetermined number of from the network node( ) in response to transmitting the HARQ buffer data packets; performing a checksum computation on the HARQ buffer; transmitting the computed checksum to the group members; and receiving a notification/information from at least one group number when the computed checksum differs from a calculated checksum performed by at least a another group member; the notification notifying that the at least another group member stops or refrains from further transmission of the HARQ buffer data to the network node According to another aspect of embodiments herein, there is provided a first UE for group transmission, the group comprising multiple UEs transmitting same HARQ, buffer data packets to a network node in a synchronous manner, the data packets received from a UE in the group, the first UE: comprising a processor and a memory; said memory containing instructions executable by the processor whereby the first UE is operative to: receive a predetermined number of NACKs from the network node in response to transmitting the HARQ buffer data packets; perform a checksum calculation on the HARQ buffer; receive a computed checksum from a second UE, acting as a coordinator of the group; compare the calculated checksum with the received computed checksum; and stop or refrain from further transmission of the HARQ buffer data to the network node when the calculated checksum and the received computed checksum differ.

According to another aspect of embodiments herein, there is provided a second UE for group transmission, the second UE acting as a coordinator of a group, the group comprising multiple UEs transmitting same HARQ, buffer data packets to a network node in a synchronous manner, the second UE comprising a processor and a memory; said memory containing instructions executable by the processor whereby the second UE is operative to: receive a predetermined number of NACKs, from the network node in response to transmitting the HARQ buffer data packets; perform a checksum computation on the HARQ buffer; transmit the computed checksum to the group members; and receive a notification/information from at least one group number when the computed checksum differs from a calculated checksum performed by at least a another group member; the notification notifying that the at least another group member stops or refrains from further transmission of the HARQ buffer data to the network node.

An advantage with embodiments herein to achieve reliable and efficient transmissions.

Another advantage is that two steps are provided to ensured high performance of the group transmissions. The first step to of turning off unsynchronized UEs may be tuned to react very fast and reduce the impact of the unsynchronized UE. The second step of synchronization of the UEs may also be tuned to react according to traffic type or buffer status and hence ensure high performance of the UL group transmissions.

BRIEF DESCRIPTION OF THE DRAWINGS

Examples of embodiments herein are described in more detail with reference to attached drawings in which:

FIG. 3 shows HARQ feedback transmissions from the network node directly to each UE of the group including the coordinator UE.

DETAILED DESCRIPTION

In the following, a detailed description of the exemplary embodiments is described in conjunction with the drawings, in several scenarios to enable easier understanding of the solution(s) described herein.

Figure 5:
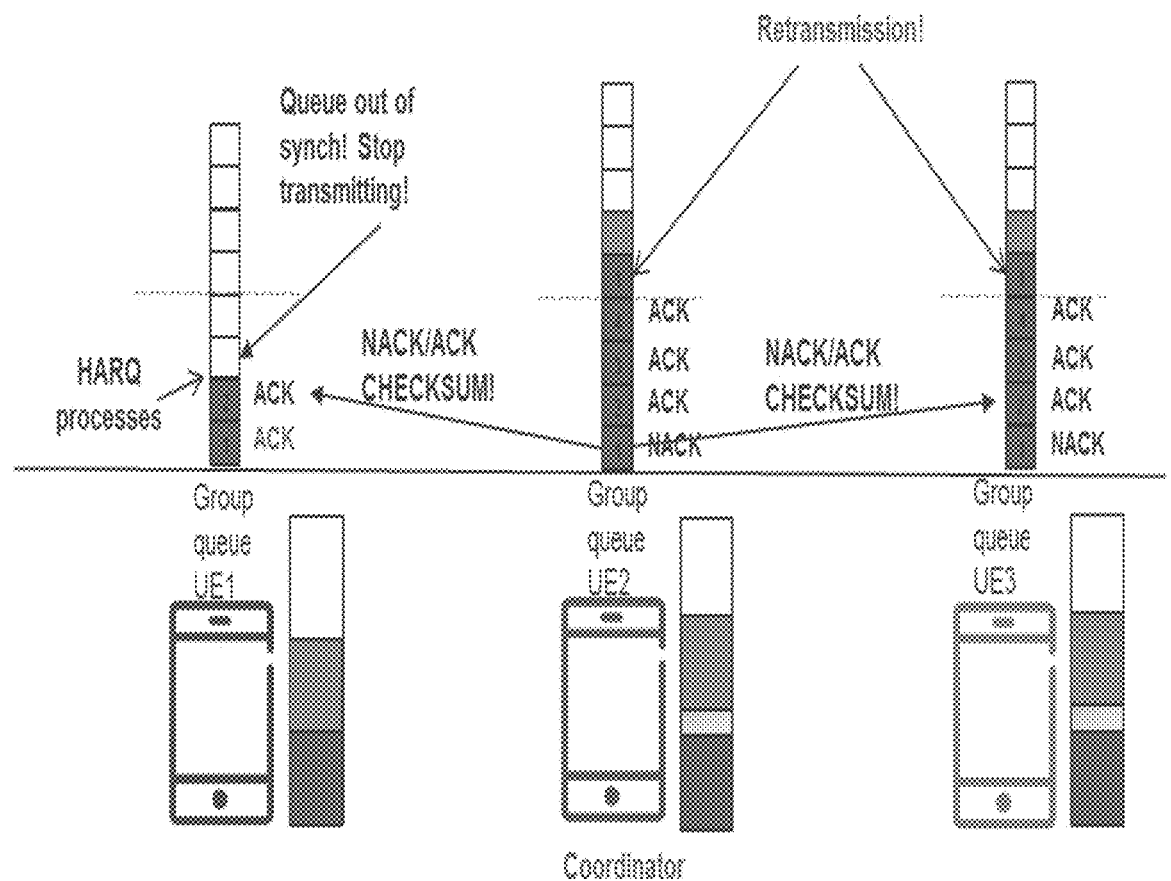
FIG. 5 illustrates how a UE will stop/refrain its transmissions when it discovers that its HARQ buffer is out-of synch in accordance with some embodiments herein.

Referring to FIG. 5 there is illustrated how a UE will stop its transmissions when it discovers that its HARQ buffer is out-of-synch according to some embodiments herein.

Figure 1:
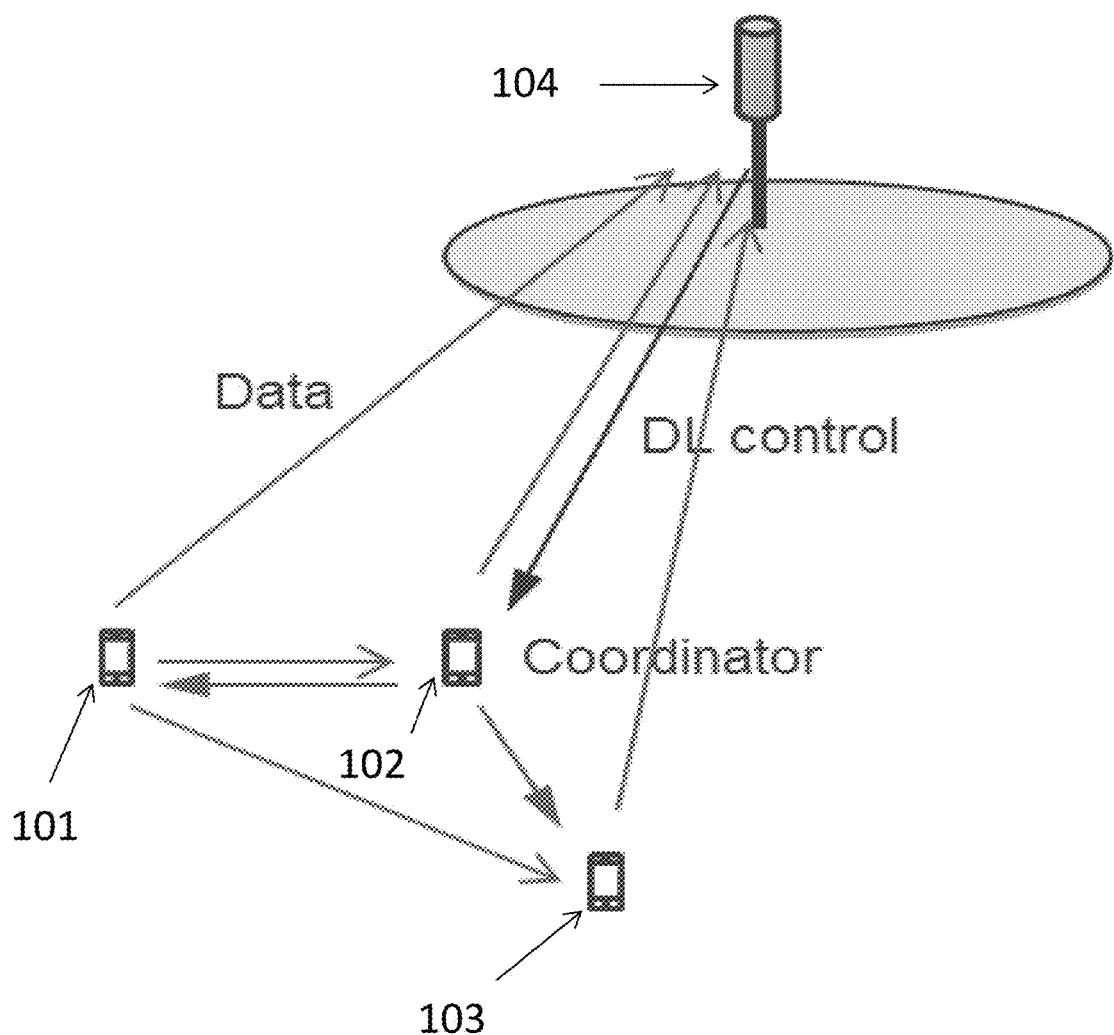
FIG. 1 is an example of a group transmission concept.
Figure 2:
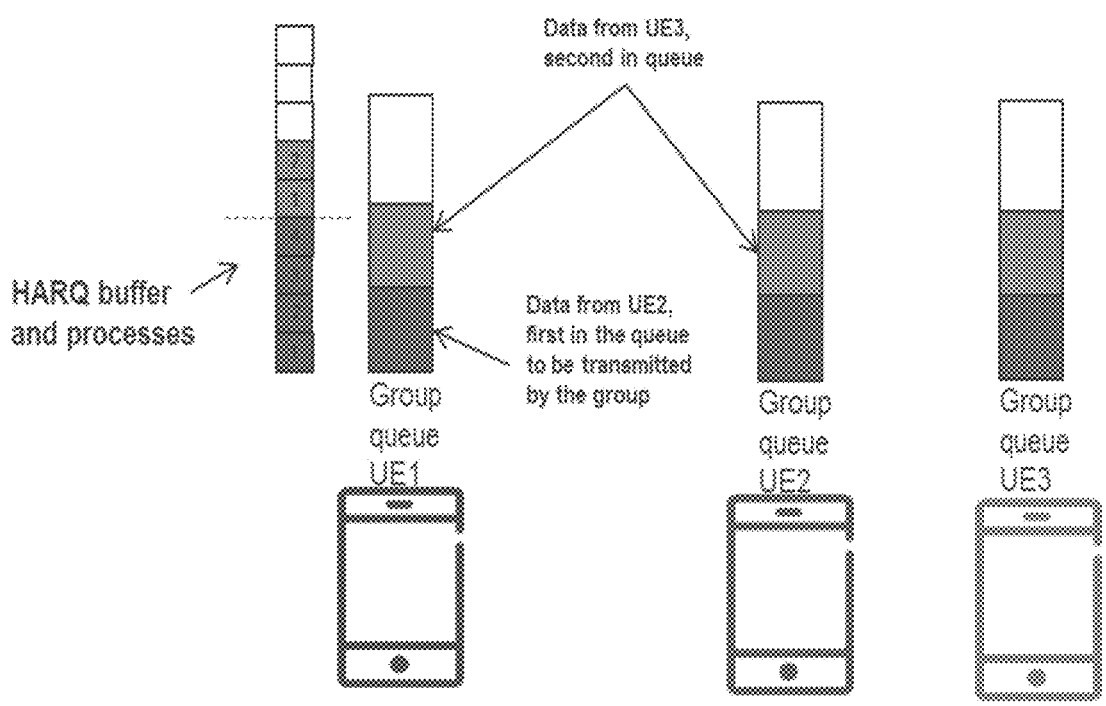
FIG. 2 illustrates an another example of a group transmission. Here the data from the group is moved to the HARQ buffers at each UE.
Figure 3:
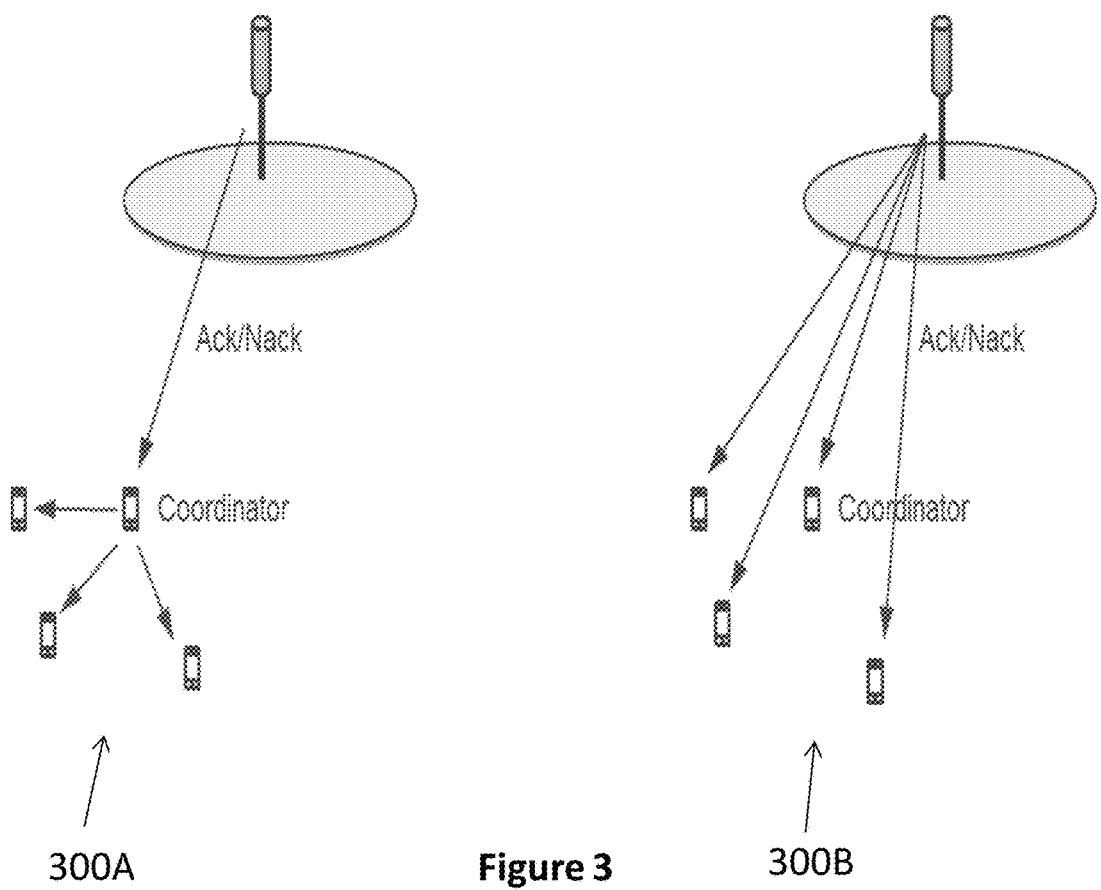
FIG. 3 shows HARQ feedback transmissions from the network node via a coordinator UE to the other UEs of the group.
Figure 4:
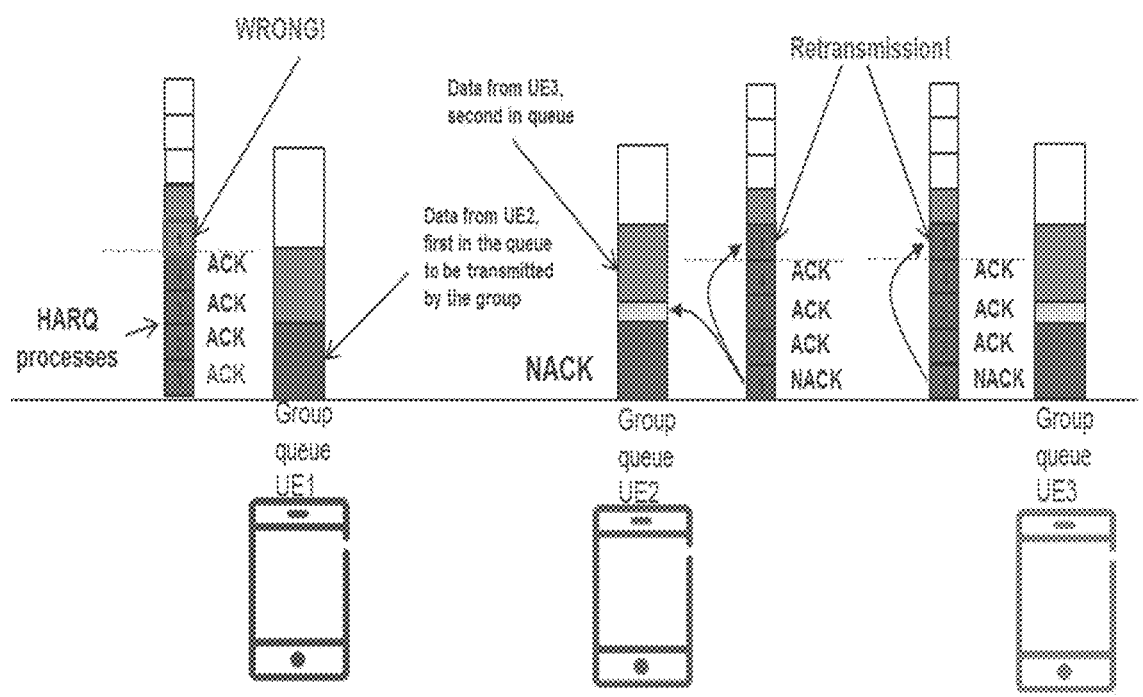
FIG. 4 is a schematic view of unsynchronized transmissions resulting from the first UE interpreting a NACK as an ACK.

Similarly to FIG. 4, 3 UEs (UE1, UE2 and UE3) are depicted in FIG. 5 and also HARQ processes. UE2 is here acting as a coordinator.

In this scenario, the procedure includes making UE1 stop or refrain from transmitting if its HARQ buffer as it gets out-of-synch with the other UEs (U2, U3) in the group (i.e. with the coordinator). This is achieved by transmitting a checksum computed over the group HARQ buffer at regular (configurable) time intervals. The checksum transmission could also be triggered by a HARQ NACK (which are less common than ACKs) or similar e.g. every nth NACK or min (nth NACK, interval). If the checksum is correct then the UE goes proceeds with transmission of HARQ buffer data. If the checksum is not correct, the UE stops or refrains from further transmission. This is shown in FIG. 5 where the checksum is sent by the coordinator UE2 when the coordinator receives its first NACK.

This approach, in accordance with some embodiments herein, will stop UEs that get out-of-synch from transmitting and they will not interfere with the other UEs transmissions. Other alternative is that whenever the coordinator receives a NACK or a a predetermined number of NACKs, it will forward this to the other UEs, using e.g. some D2D o sidelink protocol with some known timing relation; so that all UEs in the group may confirm that there was a NACK in a certain TTI. The UEs then stop transmitting in case they discover that they are out-of-synch or continue transmitting if they had received the same NACK from the network node in response to transmission of the HARQ buffer data packets, making this approach very reliable.

As more and more UEs get their group HARQ buffers out-of-synch (and are not transmitting anymore) there will be a need to synch the UEs again in order to reach the achievable bit rate of the group transmissions (i.e. when all UEs in the group transmit). The synchronization of the HARQ buffers maybe be triggered e.g. when k out of the n UEs in the group are unsynchronized. The actual synch may be done by flushing the transmission buffers and resending content from the coordinator to the UEs.

Here it is assumed that all UEs in the group will receive the HARQ feedback directly from the eNodeB, i.e. it is not relayed from the coordinator as previously described. The algorithm/solution/procedure may be initiated by setting the checksum transmission rate (ChS_rate). Depending on implementation this may be given as a timer value (ms) or as a NACK counter indicating a predetermined number of received HARQ NACKS from the network node (e.g. checksum transmission is done when the timer expires or the coordinator receives every ChS_rate NACK). The group transmission UEs and the coordinator UE may be configured to maintain a NACK counter or a NACK timer. Then the UL transmissions are started and whenever the NACK counter or the timer expires; e.g. the number of NACKs reach a threshold e.g. ChS_rate or the timer reaches a threshold e.g. ChS_rate, the coordinator is configured to compute a checksum over the HARQ buffer (or part of the HARQ buffer if this has been defined). The coordinator UE is further configured to send or transmit the checksum over e.g. a D2D link or a sidelink to the other UE members of the group. Since the other group members also will know the ChS_rate they will be expecting to receive the coordinators checksum and they can compare it to their own checksums. If it does not match for a group member, this UE will stop from further UL transmissions and notify the coordinator.

Figure 6:
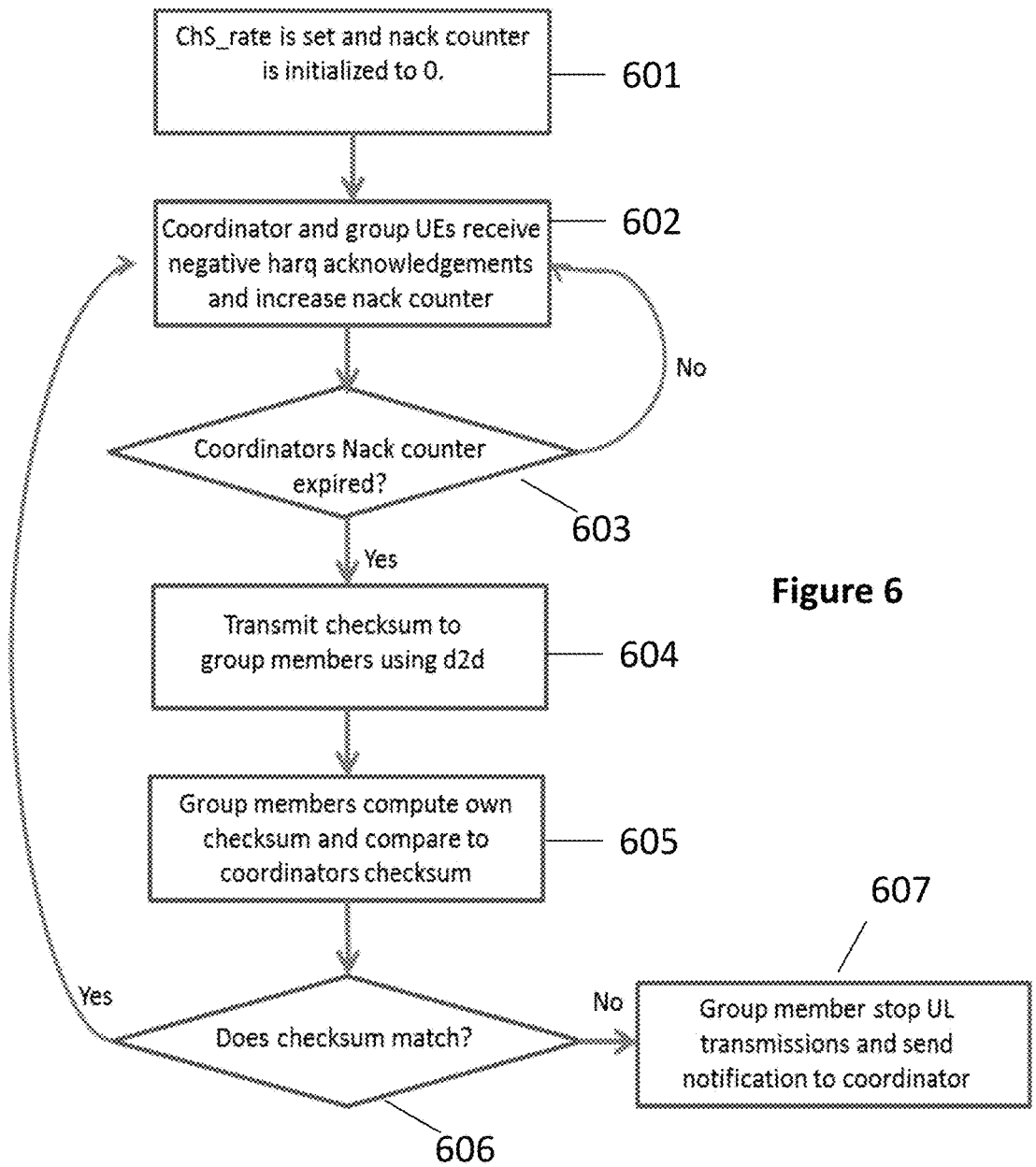
FIG. 6 is a flowchart depicting a stopping of unsynchronized UE transmissions (HARQ operation mode 1) according to some embodiments herein.

Since the group member knows, in accordance with an embodiment herein, the threshold ChS_rate and if it is based on the number of received NACKs, the UEs will know if they are out-of-synch by receiving the checksum when they are not expecting. For example, if a UE in the group has detected an ACK but receives a checksum from the coordinator UE it knows the ACK was in fact a NACK. Also, if the UE detects a NACK but does not receive a checksum it also knows the NACK was in fact an ack. In case a UE discovers it is out-of-synch due to receiving/not receiving a checksum when not expecting/expecting it immediately stops transmitting and notifies the coordinator. Note that if the ChS_rate is based on a timer instead of NACKs, the UE will not receive any unexpected checksums indicating that it is out-of-synch, thus is may be most beneficial to base it on a counter rather than a timer. A flowchart illustrating this part of the invention is shown in FIG. 6 in the case a NACK is received by all the group members including the coordinator.

As shown in Action 601, a Chs_rate maybe set and/or a NACK counter maybe set to an initial value e.g. zero.

In action 602, the coordinator UE and the group members receive a NACK i.e. a negative HARQ ACK and hence increase their counters;

If the coordinators NACK counter (or time) expires (action 603); the coordinator is configured to compute a checksum as explained above (604) and the coordinator is configured to transmit the computed checksum to group members using e.g. D2D link or sidelink. If the NACK counter hasn't yet expired the action goes back to action 603.

In action 605, the group members compute or calculate their own checksums on their HARQ buffers and further compare the received computed checksum from the coordinator with the own calculated checksum. If the checksums do not differ i.e. the checksums do not match (action 606), the group member(s) are configured to stop or refrain from further transmission. The group members may also be configured to notify/inform the coordinator that the ARQ the UE or UEs in question has/have it/their HARQ buffer(s) out-of-sync and or informing the coordinator UE that no further transmission to the network node will take place (607).

On the other hand if the checksums match, the action goes back to action 602 wherein additional reception of HARQ NACK(s) take place in addition to increasing the NACK counter or the timer for each received HARQ NACK.

As time goes on more group members will, for example, be out-of-synch with the coordinator UE and to get the users or UEs synchronized again the HARQ buffers need to be restored to be identical with the coordinator's HARQ buffer. This may be triggered by the number of group members that are out-of-synch. As an example, when k out of the n UEs in the group are out-of-synch, the synchronization is triggered. Since the group members inform or notify, as previously disclosed, the coordinator UE that they are out-of-synch the coordinator UE may decide when to re-establish the buffers. This decision may also be based on the amount of data in the UL buffer (might not be necessary to synchronize if buffer is almost empty). When the coordinators decision is taken to re-establish the buffers, the coordinator UE is configured to send or transmit the content of the buffer to the group members and a time when the transmission should be started again. The flowchart shown in FIG. 6 is here denoted HARQ operation mode 1. Below a description introducing the HARQ operation mode 2 will be explained.

Figure 7:
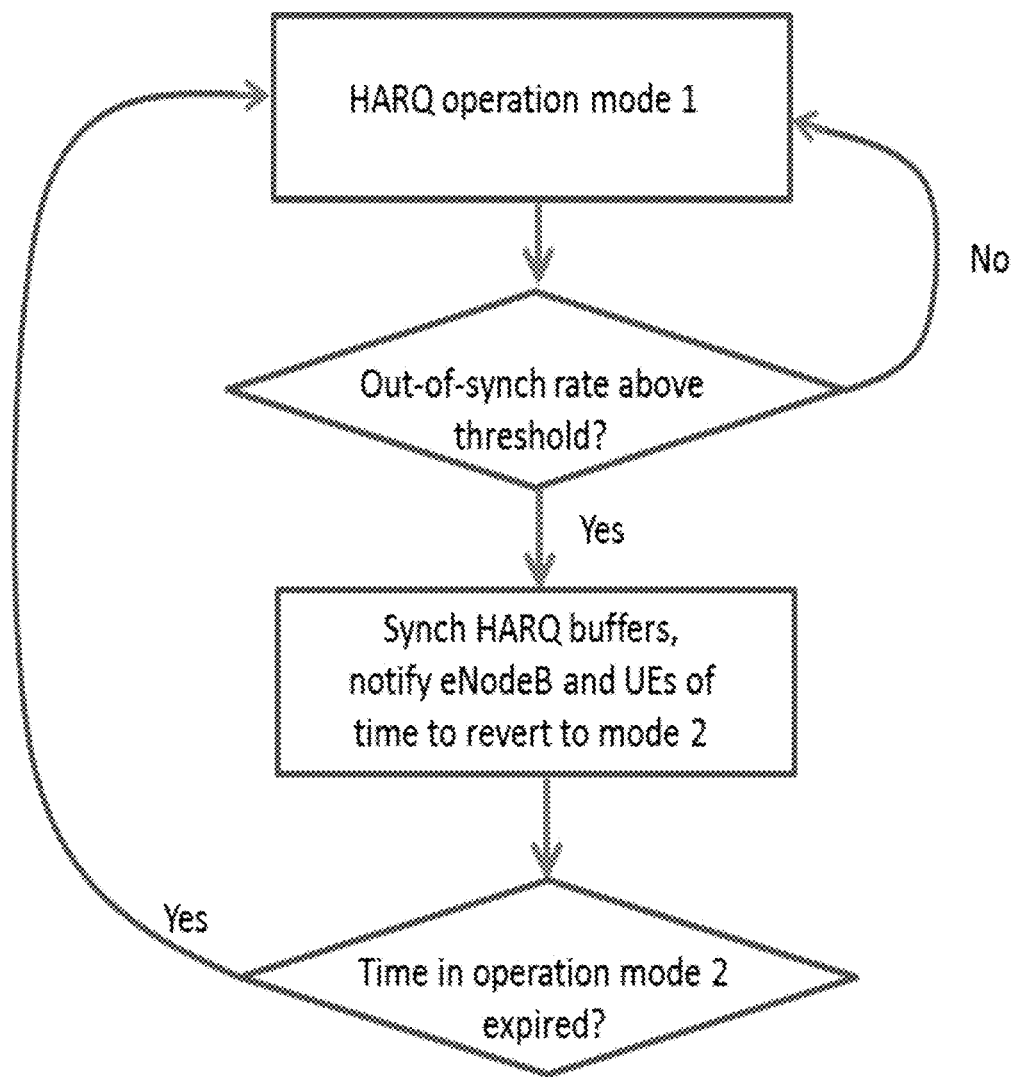
FIG. 7 illustrates another flowchart depicting switching between HARQ operation mode 1 and HARQ operation mode 2 according to some embodiments herein.

In case a switch to HARQ operation mode 2, called here autonomous HARQ retransmission is configured, the rate at which UEs get un-synchronized is monitored by the coordinator UE (i.e. number of unsynchronized UEs during a predefined time threshold). If the number of unsynchronized UEs per predefined time is above a threshold a switch to Operation mode 2 is performed by the coordinator UE notifying the radio network node e.g. the eNodeB and the group members. This means that the UEs do autonomous retransmissions (e.g. every transmission is followed by k retransmissions and there is no HARQ feedback). In this case the coordinator UE does not necessarily checksum(s) since the HARQ buffers will not get unsynchronized due to wrong interpretation of HARQ feedback. However, since Operation mode 2 is less efficient than operation mode 1 in general, a switch back to operation mode 1 is done after a predefined time. A flowchart of how switching between HARQ Operation mode 1 and Operation mode 2 is shown in FIG. 7 as explained above and hence no need to repeat it since FIG. 7 in conjunction with the description above is self-explanatory.

Figure 8:
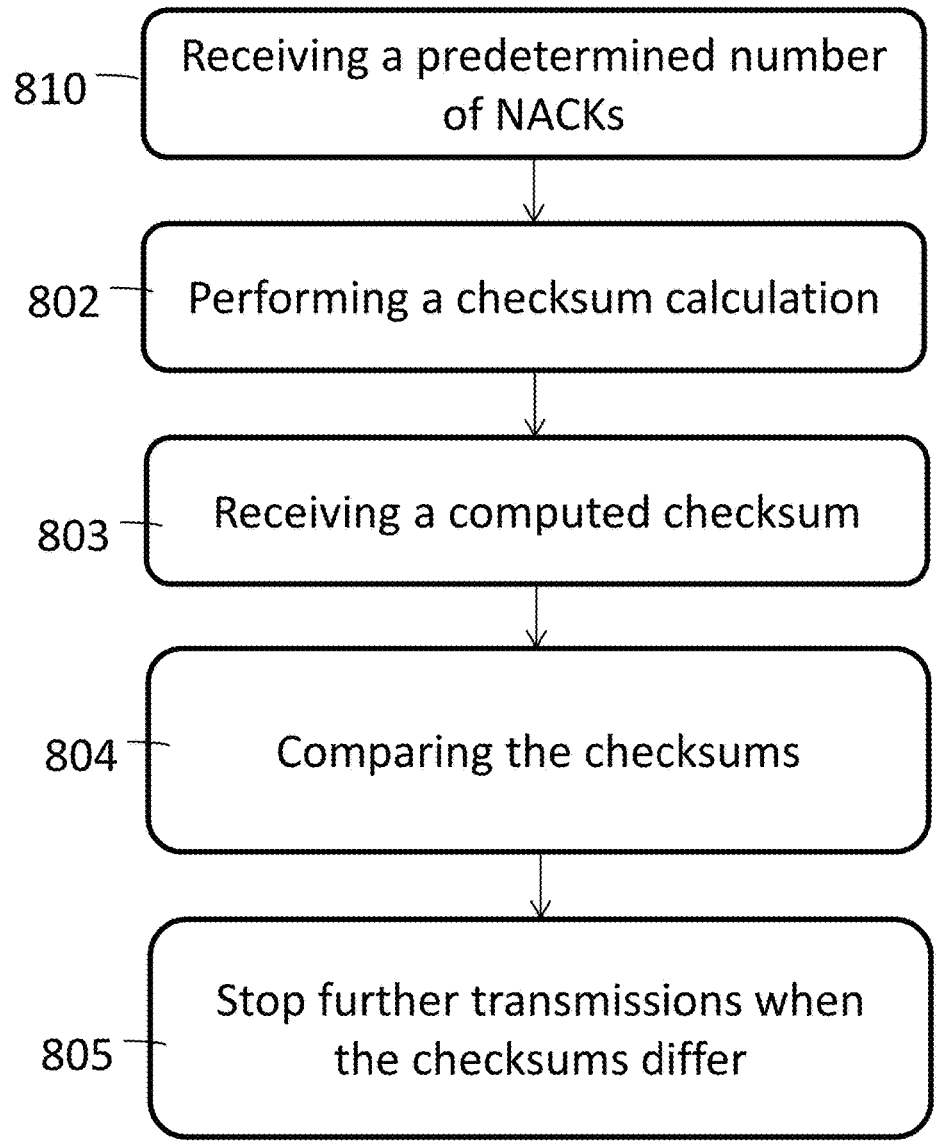
FIG. 8 is a flowchart depicting a method performed by a first UE according to embodiments herein.

Referring to FIG. 8 there is illustrated a flowchart depicting summarizing the main actions performed by a first UE (not the coordinator UE) for group transmission, in accordance with embodiments herein, the group comprising multiple UEs transmitting same HARQ buffer data packets to a network node in a synchronous manner, the data packets received from a UE in the group. The method comprising:

(801) receiving a predetermined number of NACKs, from the network node in response to transmitting the HARQ buffer data packets;

(802) performing a checksum calculation on the HARQ buffer;

(803) receiving a computed checksum from a second UE acting as a coordinator of the group;

(804) comparing the calculated checksum with the received computed checksum; and (805) stopping or refraining from further transmission of the HARQ buffer data to the network node when the calculated checksum and the received computed checksum differ i.e. there is a mismatch.

As previously described, the method performed by the first UE further comprising notifying/informing the second UE, acting as the coordinator of the group, that the first UE has its HARQ buffer out-of-synch and/or informing the second UE that the first UE ( ) stops transmitting HARQ buffer data to the network node. The receiving of the computed checksum and the informing of the second UE may performed using D2D or a sidelink communication protocol.

The method also comprises increasing a NACK counter for each received NACK and when the NACK counter expired i.e. is equal to the number of the predetermined number of NACKs, performing the checksum calculation. The method, as explained before, further comprising synchronizing the HARQ buffer of the first UE with the HARQ buffer of the second UE, acting as the coordinator, by receiving the HARQ buffer data content from the second UE and by receiving from the second UE information on a time instance when new transmission(s) start again at the first UE.

To perform the method or procedure steps/actions described above in relation, a first UE 900 is shown comprises the following arrangement depicted in FIG. 8, and as described below.

The first UE 900 comprises a processing circuit or a processing module or a processor or means 910, antenna circuitry (not shown); a receiver circuit or receiver module 920; a transmitter circuit or transmitter circuit 930; a memory module 940 and a transceiver circuit or transceiver module 950 which may include the transmitter circuit 930 and the receiver circuit 920.

The first UE may be a wireless device which is UE capable e.g. a mobile terminal, wireless terminal, mobile station, mobile telephone, cellular telephone, or a smart phone. Further examples of different wireless devices comprise laptops with wireless capability, Laptop Embedded Equipment (LEE), Laptop Mounted Equipment (LME), USB dongles, Customer Premises Equipment (CPE), modems, Personal Digital Assistants (PDA), or tablet computers, sometimes referred to as a surf plates with wireless capability or simply, tablets, Machine-to-Machine (M2M) capable devices or UEs, Machine Type Communication (MTC) devices such as sensors, e.g., a sensor equipped with UE, just to mention some examples.

The processing module/circuit 910 includes a processor, microprocessor, an application specific integrated circuit (ASIC), field programmable gate array (FPGA), or the like, and may be referred to as the "processor 910." The processor 910 controls the operation of the first UE 900 and its components. Memory (circuit or module) 940 includes a random access memory (RAM), a read only memory (ROM), and/or another type of memory to store data and instructions that may be used by processor 910. In general, it will be understood that the first UE 900 in one or more embodiments includes fixed or programmed circuitry that is configured to carry out the operations in any of the embodiments disclosed herein.

Figure 9:
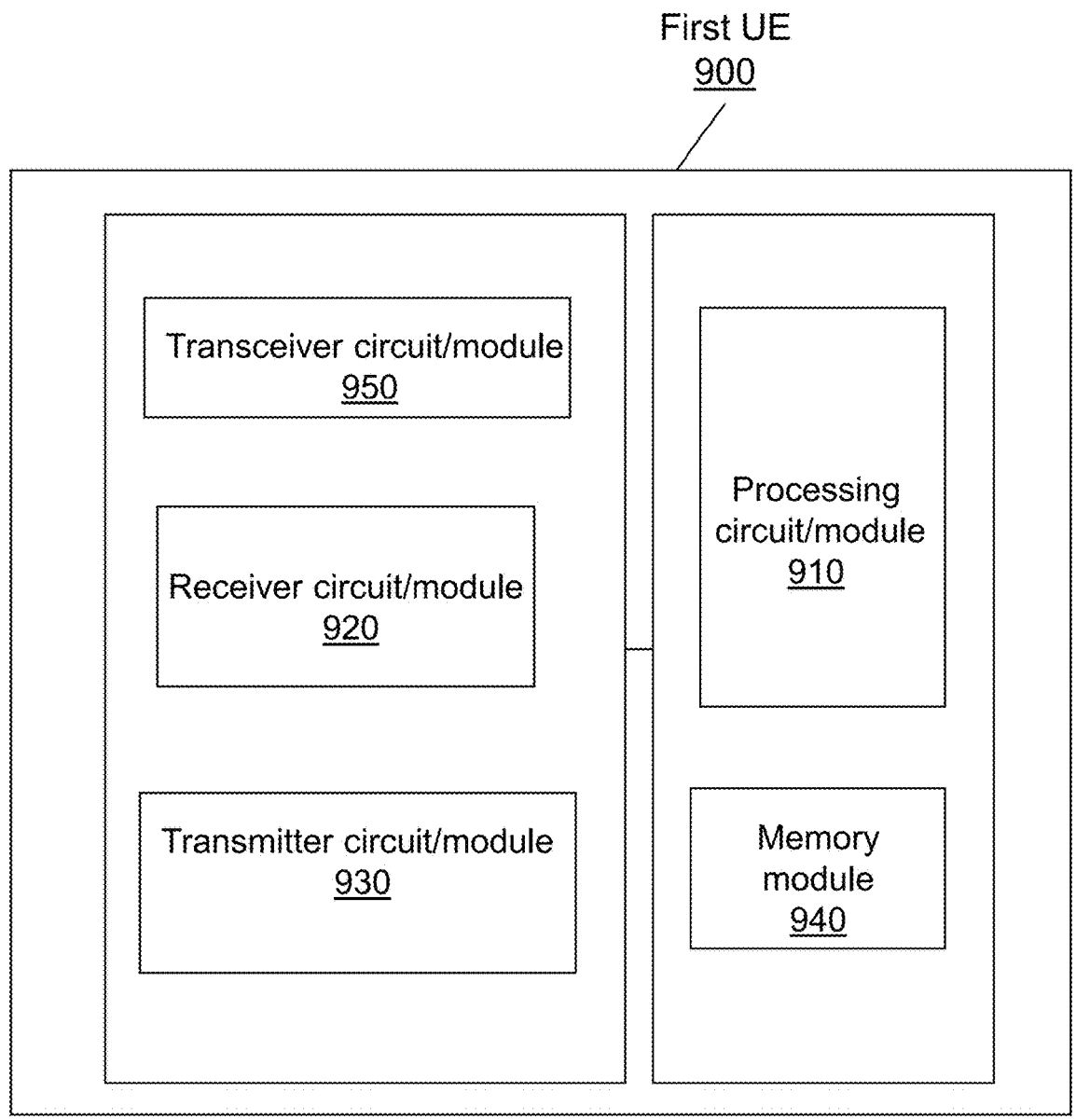
FIG. 9 is a schematic block diagram illustrating embodiments of first UE according to embodiments herein.

In at least one such example, the first UE 900 includes a microprocessor, microcontroller, DSP, ASIC, FPGA, or other processing circuitry that is configured to execute computer program instructions from a computer program stored in a non-transitory computer-readable medium that is in, or is accessible to the processing circuitry. Here, "non-transitory" does not necessarily mean permanent or unchanging storage, and may include storage in working or volatile memory, but the term does connote storage of at least some persistence. The execution of the program instructions specially adapts or configures the processing circuitry to carry out the first UE operations disclosed herein. Further, it will be appreciated that the first UE 900 may comprise additional components not shown in FIG. 9.

The receiver module/circuit 920 (also referred to as a receiver 920 or receiver circuit 920) or the transceiver module/circuit 950 (also referred to as a transmitter 950 or transmitter circuit 950) is configured to receive a predetermined number of NACKs, from the network node in response to transmitting the HARQ buffer data packets. The processing circuitry or processing module or the processor 910 is configured to perform a checksum calculation on the HARQ buffer; to receive a computed checksum from a second UE 1100 acting as a coordinator of the group; to compare the calculated checksum with the received computed checksum; and to stop/refrain from further transmission of the HARQ buffer data to the network node when the calculated checksum and the received computed checksum differ.

The processing circuitry/module 910 is further configured or operative to notify/inform the second UE 1100, acting as the coordinator of the group, that the first UE 900 has its HARQ buffer out-of-synch and/or informing the second UE 1100 that the first UE 900 stops transmitting HARQ buffer data to the network node. The processing circuitry/module 910 is configured to receive the computed checksum and inform the second UE 1100 using a Device-2-Device, D2D, or a sidelink communication protocol. The processing circuitry/module 910 is further configured to increase a NACK counter for each received NACK and when the NACK counter expired i.e. is equal to the number of the predetermined number of NACKs, to perform the checksum calculation. The processing circuitry/module 910 is further configured to synchronize the HARQ buffer of the first UE 900 with the HARQ buffer of the second UE 1100, acting as a coordinator, by receiving the HARQ buffer data content from the second UE 1100 and by receiving information from the second UE 1100 on a time instance when new transmission(s) start again at the first UE 900.

The memory module 940 may contain instructions executable by the processor or processing circuitry or processing module 910 whereby the first UE 900 is operative to perform the previously described method steps. There is also provided a computer program comprising computer readable code means which when run in the first UE 900 e.g. by means of the processor 910 causes the first UE 900 to perform the above described method steps/actions described above, which include at least: receiving a predetermined number of NACKs, from the network node in response to transmitting the HARQ buffer data packets. Performing a checksum calculation on the HARQ buffer; receiving a computed checksum from a second UE acting as a coordinator of the group; comparing the calculated checksum with the received computed checksum; and stopping/refraining from further transmission of the HARQ buffer data to the network node when the calculated checksum and the received computed checksum differ.

Additional operations performed by the first UE 900 have already been described.

An advantage with embodiments herein to achieve reliable and efficient transmissions.

Another advantage is that two steps are provided to ensured high performance of the group transmissions. The first step to of turning off (i.e. not allowed to transmit) unsynchronized UEs may be tuned to react very fast and reduce the impact of the unsynchronized UE. The second step of synchronization of the UEs may also be tuned to react according to traffic type or buffer status and hence ensure high performance of the UL group transmissions.

As previously described, a second UE 1100 acting as a coordinator is involved in the embodiments herein.

Figure 10:
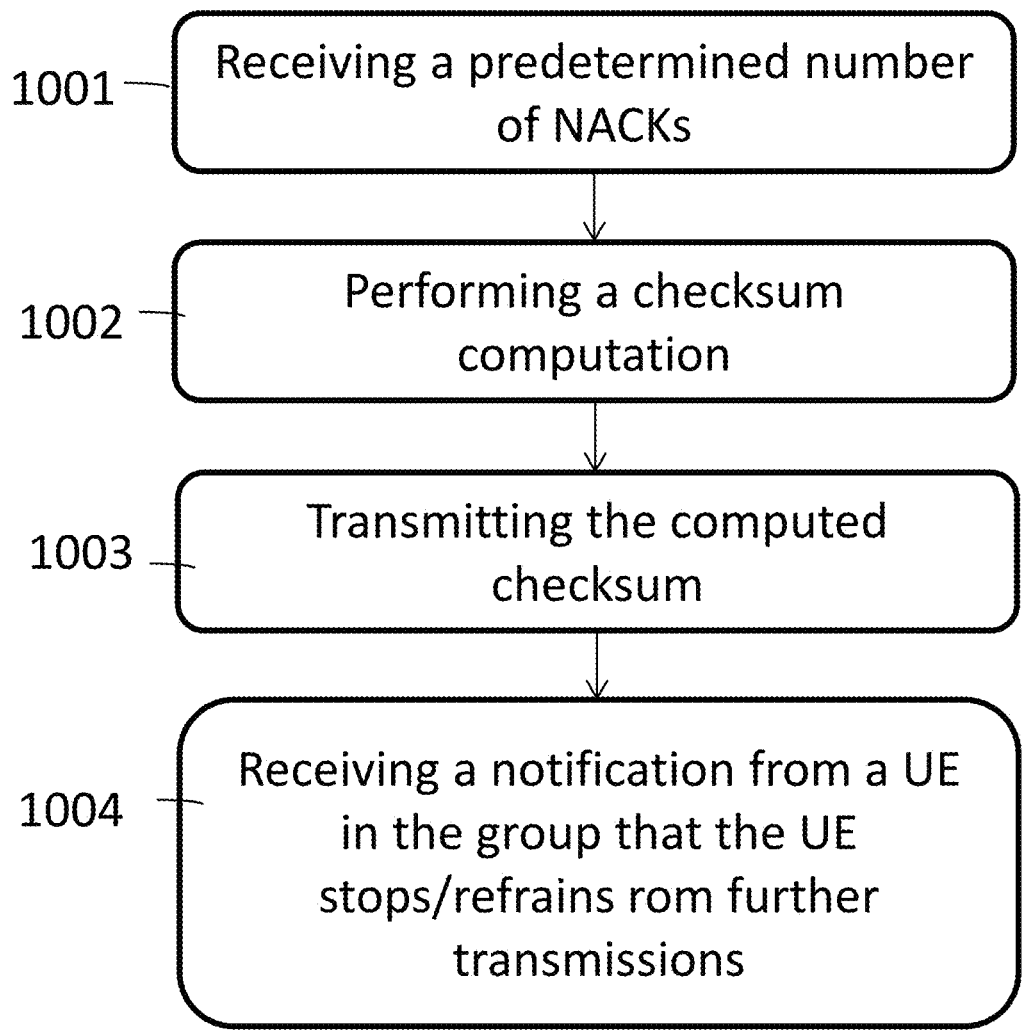
FIG. 10 is a flowchart depicting a method performed by a second UE, acting as a coordinator, according to embodiments herein.

Referring to FIG. 10 there is illustrated a flowchart depicting summarizing the main actions performed by a second UE (the coordinator UE) for group transmission, in accordance with embodiments herein, the group comprising multiple UEs transmitting same HARQ buffer data packets to a network node in a synchronous manner, the method comprising:

(1001) receiving a predetermined number of NACKs, from the network node( ) in response to transmitting the HARQ buffer data packets;

(1002) performing a checksum computation on the HARQ buffer;

(1003) transmitting the computed checksum to the group members; and (1004) receiving a notification/information from at least one group number when the computed checksum differs from a calculated checksum performed by at least a another group member; the notification notifying that the at least another group member stops/refrains from further transmission of the HARQ buffer data to the network node.

As previously described, the method performed by the coordinator UE further comprising determining whether an out-of-sync rate is above a threshold, and that being the case; synchronizing the HARQ buffer with the HARQ buffer of the at least another group member, by transmitting a HARQ buffer data content to the at least another group member and notifying/informing the at least another group member on a time instance when the at least another group member starts a new transmission.

The out-of-sync rate is above a threshold is determined when the number of unsynchronized group members per predefined time is above the threshold.

Figure 11:
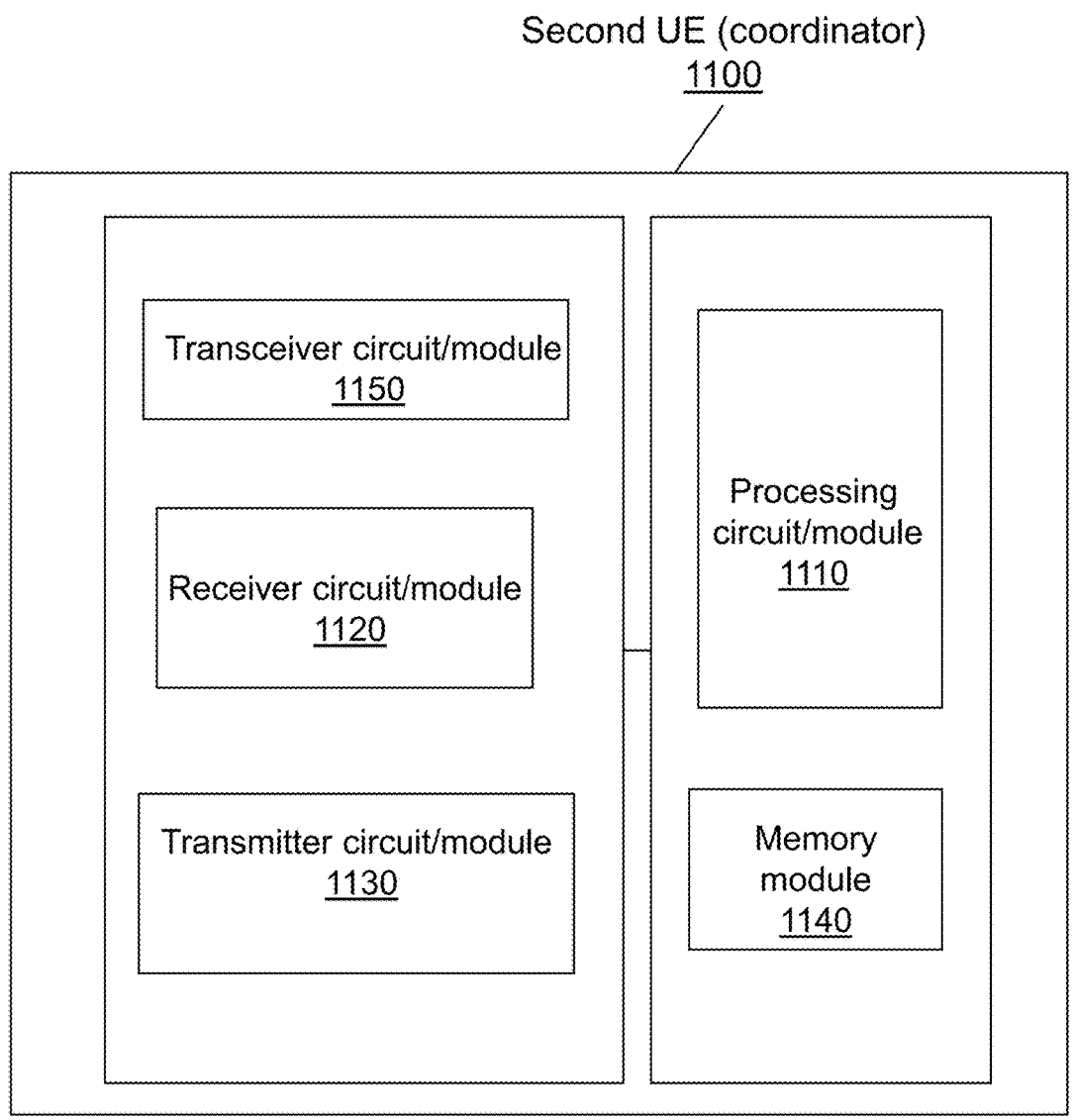
FIG. 11 is a schematic block diagram illustrating embodiments of the second UE (the coordinator) according to embodiments herein.

The method also comprises notifying the network node of the time instance when the at least another group member starts a new transmission To perform the method or procedure steps/actions described above in relation, a second UE 900, being a coordinator, is shown comprises the following arrangement depicted in FIG. 11, and as described below.

The second UE 1100 comprises a processing circuit or a processing module or a processor or means 1110, antenna circuitry (not shown); a receiver circuit or receiver module 1120; a transmitter circuit or transmitter circuit 1130; a memory module 1140 and a transceiver circuit or transceiver module 1150 which may include the transmitter circuit 1130 and the receiver circuit 1120.

The second UE 1100 may be a wireless device which is UE capable e.g. a mobile terminal, wireless terminal, mobile station, mobile telephone, cellular telephone, or a smart phone. Further examples of different wireless devices comprise laptops with wireless capability, Laptop Embedded Equipment (LEE), Laptop Mounted Equipment (LME), USB dongles, Customer Premises Equipment (CPE), modems, Personal Digital Assistants (PDA), or tablet computers, sometimes referred to as a surf plates with wireless capability or simply, tablets, Machine-to-Machine (M2M) capable devices or UEs, Machine Type Communication (MTC) devices such as sensors, e.g., a sensor equipped with UE, just to mention some examples.

The processing module/circuit 1110 includes a processor, microprocessor, an application specific integrated circuit (ASIC), field programmable gate array (FPGA), or the like, and may be referred to as the "processor 1110." The processor 1110 controls the operation of the second UE 1100 and its components. Memory (circuit or module) 1140 includes a random access memory (RAM), a read only memory (ROM), and/or another type of memory to store data and instructions that may be used by processor 1110. In general, it will be understood that the second UE 1100 in one or more embodiments includes fixed or programmed circuitry that is configured to carry out the operations in any of the embodiments disclosed herein.

In at least one such example, the second UE 1100 includes a microprocessor, microcontroller, DSP, ASIC, FPGA, or other processing circuitry that is configured to execute computer program instructions from a computer program stored in a non-transitory computer-readable medium that is in, or is accessible to the processing circuitry. Here, "non-transitory" does not necessarily mean permanent or unchanging storage, and may include storage in working or volatile memory, but the term does connote storage of at least some persistence. The execution of the program instructions specially adapts or configures the processing circuitry to carry out the second UE operations disclosed herein. Further, it will be appreciated that the second UE 1100 may comprise additional components not shown in FIG. 11.

The receiver module/circuit 1120 (also referred to as a receiver 1120 or receiver circuit 1120) or the transceiver module/circuit 1150 (also referred to as a transmitter 1150 or transmitter circuit 1150) is configured to receive a predetermined number of NACKs, from the network node in response to transmitting the HARQ buffer data packets. The processing circuitry or processing module or the processor 1110 is configured to perform a checksum computation or calculation on the HARQ buffer; to transmit the computed checksum to the group member; and to receive a notification/information from at least one group number when the computed checksum differs from a calculated checksum performed by at least a another group member; the notification notifying that the at least another group member stops/refrains from further transmission of the HARQ buffer data to the network node.

The processing circuitry or module or processor 1100 is further configured or operative to determine whether an out-of-sync rate is above a threshold, and that being the case; to synchronize the HARQ buffer with the HARQ buffer of the at least another group member, by transmitting a HARQ buffer data content to the at least another group member and to notify/inform the at least another group member on a time instance when the at least another group member starts a new transmission. An out-of-sync rate is above a threshold is determined when the number of unsynchronized group members per predefined time is above the threshold. The second UE 1100 is further configured to notify the network node of the time instance when the at least another group member starts a new transmission.

The memory module 1140 may contain instructions executable by the processor or processing circuitry or processing module 1110 whereby the second UE 1100 is operative to perform the previously described method steps. There is also provided a computer program comprising computer readable code means which when run in the second UE 1100 e.g. by means of the processor 1110 causes the second UE 1100 to perform the above described method steps/actions described above, which include at least: receiving a predetermined number of NACKs, from the network node in response to transmitting the HARQ buffer data packets; performing a checksum computation on the HARQ buffer; transmit the computed checksum to the group members; and receiving a notification/information from at least one group number when the computed checksum differs from a calculated checksum performed by at least a another group member; the notification notifying that the at least another group member stops/refrains from further transmission of the HARQ buffer data to the network node Additional operations performed by the second UE 1100 have already been described.

As previously described an advantage with embodiments herein to achieve reliable and efficient transmissions. Another advantage is that two steps are provided to ensured high performance of the group transmissions. The first step to of turning off (i.e. not allowed to transmit) unsynchronized UEs may be tuned to react very fast and reduce the impact of the unsynchronized UE. The second step of synchronization of the UEs may also be tuned to react according to traffic type or buffer status and hence ensure high performance of the UL group transmissions.

Throughout this disclosure, the word "comprise" or "comprising" has been used in a non-limiting sense, i.e. meaning "consist at least of". Although specific terms may be employed herein, they are used in a generic and descriptive sense only and not for purposes of limitation. In particular, it should be noted that although terminology from 3GPP LTE has been used in this disclosure to exemplify the invention, this should not be seen as limiting the scope of the invention to only the aforementioned system. Other wireless systems, including LTE-A (or LTE-Advanced), 5G, UMTS, WiMax, and WLAN employing D2D communications may also benefit from exploiting the ideas covered within this disclosure.

The invention claimed is:

1. A method performed by a first user equipment, (UE), for group transmission, the group comprising multiple UEs transmitting a same Hybrid Automatic Repeat request, (HARQ) buffer data packets to a network node in a synchronous manner, the method comprising:
   receiving a predetermined number of negative acknowledgments (NACKs) from the network node in response to transmitting the HARQ buffer data packets;
   performing a checksum calculation on a HARQ buffer associated with the HARQ buffer data packets;
   receiving a computed checksum from a second UE that relays control data from the network node to the multiple UEs in the group, the computed checksum being associated with the HARQ buffer data packets;
   comparing, by the first UE the calculated checksum with the received computed checksum; and
   refraining, by the first UE from further transmission of the HARQ buffer data packets to the network node when the calculated checksum and the received computed checksum differ.

2. The method according to claim 1, further comprising informing the second UE at least one of that:
   the first UE has its HARQ buffer out-of-synch; and the first UE stops transmitting HARQ buffer data to the network node.

3. The method according to claim 2, wherein receiving the computed checksum and informing the second UE is performed using one of a Device-2-Device, D2D, and a sidelink communication protocol.

4. The method according to claim 3, further comprising synchronizing the HARQ buffer of the first UE with the HARQ buffer of the second UE, by receiving the HARQ buffer data content from the second UE and by receiving from the second UE information on a time instance when new transmissions start again at the first UE.

5. The method according to claim 2, further comprising synchronizing the HARQ buffer of the first UE with the HARQ buffer of the second UE, acting as the coordinator, by receiving the HARQ buffer data content from the second UE and by receiving from the second UE information on a time instance when new transmissions start again at the first UE.

6. The method according to claim 1, comprising increasing a NACK counter for each received NACK; and
   when the NACK counter expired, performing the checksum calculation.

7. A method performed by a second user equipment, (UE) that relays control data from a network node to a group, the group comprising multiple UEs transmitting same Hybrid Automatic Repeat request, (HARQ) buffer data packets to a network node in a synchronous manner, the method comprising:

receiving a predetermined number of negative acknowledgements (NACKs) from the network node in response to transmitting the HARQ buffer data packets;

performing a checksum computation on a HARQ buffer associated with the HARQ buffer data packets;

transmitting the computed checksum to the multiple UEs in the group; and receiving a notification from at least one of the multiple UEs in the group when the computed checksum differs from a calculated checksum associated with the HARQ buffer data packets that is performed by at least one of the multiple UEs in the group, wherein at least one of the multiple UEs in the group discovers it is out-of-synch based on receiving and/or not receiving the computed checksum, the notification notifying that the at least one of the multiple UEs in the group refrains from further transmission of the HARQ buffer data to the network node based on discovering it is out-of-synch.

8. The method according to claim 7, further comprising determining whether an out-of-sync rate is above a threshold, and when the out-of-sync rate is above the threshold:

synchronizing the HARQ buffer with the HARQ buffer of the at least one of the multiple UEs in the group, by transmitting a HARQ buffer data content to the at least one other UE in the group; and informing the at least one of the multiple UEs in the group on of a time instance when the at least another group starts a new transmission.

9. The method according to claim 8, wherein the out-of-sync rate being above the threshold is determined when the number of unsynchronized UEs in the group per predefined time is above the threshold.

10. The method according to claim 8, further comprising notifying the network node of the time instance when the at least one of the multiple UEs in the group starts a new transmission.

11. A first user equipment, (UE) for group transmission, the group comprising multiple UEs transmitting a same Hybrid Automatic Repeat request, (HARQ) buffer data packets to a network node in a synchronous manner the first UE comprising a processor and a memory, the memory containing instructions executable by the processor to configure the first UE to:

receive a predetermined number of negative acknowledgments (NACK) from the network node in response to transmitting the HARQ buffer data packets;

perform a checksum calculation on a HARQ buffer associated with the HARQ buffer data packets;

receive a computed checksum from a second that relays control data from the network node to the multiple UEs in the group, the computed checksum being associated with the HARQ buffer data packets;

compare, by the first UE the calculated checksum with the received computed checksum; and refrain, by the first UE from further transmission of the HARQ buffer data packets to the network node when the calculated checksum and the received computed checksum differ.

12. The first UE according to claim 11, further configured to inform the second UE at least one of that:

the first UE has its HARQ buffer out-of-synch; and
the first UE stops transmitting HARQ buffer data to the network node.

13. The first UE according to claim 12, further configured to receive the computed checksum and inform the second UE using one of a Device-2-Device, (D2D) and a sidelink communication protocol.

14. The first UE according to claim 12, further configured to synchronize the HARQ buffer of the first UE with the HARQ buffer of the second UE by receiving the HARQ buffer data content from the second UE and by receiving information from the second UE on a time instance when new transmissions start again at the first UE.

15. The first UE according to claim 11, further configured to:

increase a NACK counter for each received NACKU; and
when the NACK counter expired, perform the checksum calculation.

16. A second user equipment UE for group transmission, the second UE configured to relay control data form a network node to a group, the group comprising multiple UEs transmitting a same Hybrid Automatic Repeat request, (HARQ) buffer data packets to a network node in a synchronous manner, the second UE comprising a processor and a memory, the memory containing instructions executable by the processor to configure the second UE to:

receive a predetermined number of negative acknowledgements (NACK) from the network node in response to transmitting the HARQ buffer data packets;

perform a checksum computation on a HARQ buffer associated with the HARQ buffer data packets;

transmit the computed checksum to multiple UEs in the group; and receive a notification from at least one of the multiple UEs in the group when the computed checksum differs from a calculated checksum associated with the HARQ buffer data packets that is performed by at least one of the multiple UEs in the group, wherein at least one of the multiple UEs in the group discovers it is out-of-synch based on receiving and/or not receiving the computed checksum, the notification notifying that the at least one of the multiple UEs in the group refrains from further transmission of the HARQ buffer data to the network node based on discovering it is out-of-synch.

17. The second UE according to claim 16, further configured to determine whether an out-of-sync rate is above a threshold, and when the out-of-sync rate is above the threshold:

synchronize the HARQ buffer with the HARQ buffer of the at least one of the multiple UEs of the group, by transmitting a HARQ buffer data content to the at least one other UE in the group; and notify the at least one of the multiple UEs in the group on a time instance when the at least one of the multiple UEs in the group starts a new transmission.

18. The second UE according to claim 17, wherein the out-of-sync rate being above the threshold is determined when a number of unsynchronized UEs in the group per predefined time is above the threshold.

19. The second UE according to claim 17, further configured to notify the network node of the time instance when the at least one of the multiple UEs in the group starts a new transmission.

* * * * *